United States Patent
Resnick et al.

(10) Patent No.: US 11,126,083 B2
(45) Date of Patent: Sep. 21, 2021

(54) SUPERSTRATE AND A METHOD OF USING THE SAME

(71) Applicant: CANON KABUSHIKI KAISHA, Tokyo (JP)

(72) Inventors: Douglas J. Resnick, Leander, TX (US); Niyaz Khusnatdinov, Round Rock, TX (US); Christopher Ellis Jones, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 608 days.

(21) Appl. No.: 15/879,061

(22) Filed: Jan. 24, 2018

(65) Prior Publication Data
US 2019/0227437 A1    Jul. 25, 2019

(51) Int. Cl.
*G03F 7/09* (2006.01)
*C03C 17/42* (2006.01)
(Continued)

(52) U.S. Cl.
CPC ............ *G03F 7/094* (2013.01); *C03C 17/225* (2013.01); *C03C 17/23* (2013.01); *C03C 17/42* (2013.01);
(Continued)

(58) Field of Classification Search
CPC ......... G03F 7/094; C03C 17/42; C03C 17/23; C03C 17/225; B32B 2315/08; B32B 2313/04
See application file for complete search history.

(56) References Cited

U.S. PATENT DOCUMENTS

| 5,736,424 A | 4/1998 | Prybyla et al. |
| 6,797,607 B2 | 9/2004 | Endisch et al. |

(Continued)

FOREIGN PATENT DOCUMENTS

| JP | 2009149097 A | 7/2009 |
| JP | 2011529626 A | 12/2011 |
| JP | 2016528741 A | 9/2016 |

OTHER PUBLICATIONS

Bailey et al., "Step and Flash Imprint Lithography: Template Surface Treatment and Defect Analysis", Journal of Vacuum Science & Technology B 18 (6), Nov./Dec. 2000, Microelectronics and Nanometer Structures, pp. 3572-3577.
(Continued)

*Primary Examiner* — Jasper Saberi
(74) *Attorney, Agent, or Firm* — Abel Schillinger, LLP

(57) ABSTRACT

A superstrate can include a body having a surface; a buffer layer overlying the surface; and a protective layer overlying the buffer layer, wherein the protective layer has a surface roughness that is equal to or less than a surface roughness of the surface of the body. The protective layer can include a material that can be selectively removed with respect to the buffer layer, and the buffer layer can include a material that can be selectively removed with respect to the body of the superstrate. The superstrate can be used for more planarization or other processing sequences before the body needs to be replaced, as any defects that may form extend into the protective layer or buffer layer and not reach the body. The layers can be removed and replaced by corresponding new layers without significantly adversely affecting the body.

12 Claims, 3 Drawing Sheets

(51) Int. Cl.
*C03C 17/23* (2006.01)
*C03C 17/22* (2006.01)

(52) U.S. Cl.
CPC ....... *B32B 2250/03* (2013.01); *B32B 2255/20* (2013.01); *B32B 2307/724* (2013.01); *B32B 2313/04* (2013.01); *B32B 2315/08* (2013.01); *B32B 2457/14* (2013.01); *C03C 2218/152* (2013.01); *C03C 2218/33* (2013.01)

(56) References Cited

U.S. PATENT DOCUMENTS

| | | |
|---|---|---|
| 7,241,395 B2 | 7/2007 | Sreenivasan et al. |
| 8,394,282 B2 | 3/2013 | Panga et al. |
| 8,541,053 B2 | 9/2013 | Menezes et al. |
| 8,961,800 B2 | 2/2015 | Sreenivasan et al. |
| 9,063,409 B2 | 6/2015 | Khusnatdinov et al. |
| 9,415,418 B2 | 8/2016 | Sreenivasan et al. |
| 2009/0084136 A1 | 4/2009 | Zhang et al. |
| 2010/0078846 A1 | 4/2010 | Resnick et al. |
| 2010/0104852 A1 | 4/2010 | Fletcher et al. |
| 2010/0109195 A1 | 5/2010 | Xu et al. |
| 2010/0109201 A1* | 5/2010 | Fletcher ................ B82Y 10/00 264/334 |
| 2011/0192302 A1* | 8/2011 | Selinidis ................ B82Y 40/00 101/463.1 |
| 2012/0073462 A1* | 3/2012 | Imhof .................... B82Y 40/00 101/450.1 |
| 2017/0106399 A1* | 4/2017 | Sreenivasan .......... B05C 11/028 |

OTHER PUBLICATIONS

Chen et al., "Defect Control in Nanoimprint Lithography", Journal of Vacuum Science & Technology B 23 (6), Nov./Dec. 2005, Microelectronics and Nanometer Structures, pp. 2933-2938.

Chou, "Nanoimprint Lithography", Nanofabrication Handbook, Section 9.4.4.2, pp. 201-202, 2012, CRC Press, Boca Raton, FL, 2012.

\* cited by examiner

SUPERSTRATE AND A METHOD OF USING THE SAME

FIELD OF THE DISCLOSURE

The present disclosure relates to superstrates.

RELATED ART

An adaptive imprint planarization process is disclosed in U.S. Pat. No. 8,394,282. Adaptive imprint planarization provides a surface having desired shape characteristics. Generally, topography of a first surface is mapped to provide a density map. The density map is evaluated to provide a drop pattern for dispensing polymerizable material on the first surface. The polymerizable material is solidified and etched to provide a second surface of a template, wherein the second surface has the desired shape characteristics. Additionally, adaptive imprint planarization compensates for parasitic effects of the imprinting process. The inventors have discovered a way to extend the useful life of a superstrate, such as the template in U.S. Pat. No. 8,394,282.

SUMMARY

In an aspect, a superstrate comprises a body having a surface; a buffer layer overlying the surface; and a protective layer overlying the buffer layer, wherein the protective layer has a surface that has a surface roughness that is no greater than a surface roughness of the surface of the body, wherein the protective layer includes a material that can be selectively removed with respect to the buffer layer.

In an embodiment, the surface roughness of the protective layer is less than 1 nm over a contact area of the superstrate.

In another embodiment, the body has a transmittance of at least 70% for radiation used to cure a planarization precursor material.

In still another embodiment, the protective layer includes a transparent oxide, a nitride, or an oxynitride.

In yet another embodiment, the buffer layer includes an organic compound.

In a further embodiment, the buffer layer includes spin-on carbon, photoresist, a chemical vapor deposition or physically deposited carbon film.

In another embodiment, the buffer layer, the protective layer, or both are more permeable to a process gas, as compared to the body.

In a particular embodiment, the process gas is helium.

In still another embodiment, the buffer layer or the protective layer comprises a deposited oxide, anodized alumina, an organo-silane, an organosilicate material, an organic polymer, inorganic polymers, and any combination thereof.

In yet another embodiment, the body includes soda lime glass, quartz, borosilicate glass, alkali-barium silicate glass, aluminosilicate glass, or synthetic fused silica.

In a further embodiment, the protective layer is treated with a release compound to facilitate release of the superstrate from a layer formed using the superstrate.

In another aspect, a method of forming a superstrate comprises forming a first buffer layer overlying a surface of a body; forming a first protective layer overlying the first buffer layer, wherein the first protective layer has a surface roughness that is no greater than a surface roughness of the surface of the body; wherein the protective layer includes a material that can be selectively etched with respect to the buffer layer.

In an embodiment, the method further comprises inspecting the superstrate to determine a defect density in the first protective layer along the surface; and removing the first protective layer when the defect density is above a protective layer defect threshold.

In a particular embodiment, removing the protective layer comprises dry etching, vacuum ultraviolet cleaning, or wet etching the protective layer.

In another particular embodiment, the method further comprises forming a second protective layer overlying the superstrate.

In a further particular embodiment, the method further comprises inspecting the superstrate to determine a defect density in the first buffer layer along the surface; and removing the first buffer layer when the defect density is above a buffer layer defect threshold.

In a more particular embodiment, the method further comprises forming a second buffer layer overlying the superstrate.

In a further embodiment, forming the protective layer comprises depositing the protective layer by chemical vapor deposition, atomic layer deposition, physical vapor deposition or coating the protective layer or a precursor of the protective layer.

In another embodiment, forming the buffer layer comprises coating an organic compound and curing the organic compound.

In a further aspect a superstrate can be used for forming a planarization layer over a substrate. The superstrate can include a body having a surface; and a layer overlying the surface, wherein the layer includes a material that is selectively etchable with respect to the body.

In an embodiment, an area of the superstrate is larger than an area of the substrate.

In still a further aspect, a method can include forming a superstrate for forming a planarization layer over a substrate. The method can include forming a layer overlying a surface of a body of the superstrate, wherein the layer includes a material that is selectively etchable with respect to the buffer layer.

In an embodiment, an area of the superstrate is larger than an area of the substrate.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

A superstrate can include a body having a surface that has a surface roughness over the surface that is at most a first threshold; a buffer layer overlying the surface; and a protective layer overlying the buffer layer, wherein the protective layer has a surface roughness that is at most the first threshold. The protective layer can include a material that can be selectively removed with respect to the buffer layer, and the buffer layer can include a material that can be selectively removed with respect to the body of the superstrate. The superstrate can be used for more planarization or other processing sequences before the body needs to be replaced, as defects may form which extend into the protective layer or buffer layer and not reach the body. The layers can be removed and replaced by corresponding new layers without significantly adversely affecting the body.

Details regarding the superstrate and methods of using the superstrate are better understood after reading this specification in conjunction with figures. The description below is meant to illustrate embodiments and not limit the scope of the present invention, which is defined in the appended claims.

Figure 1:
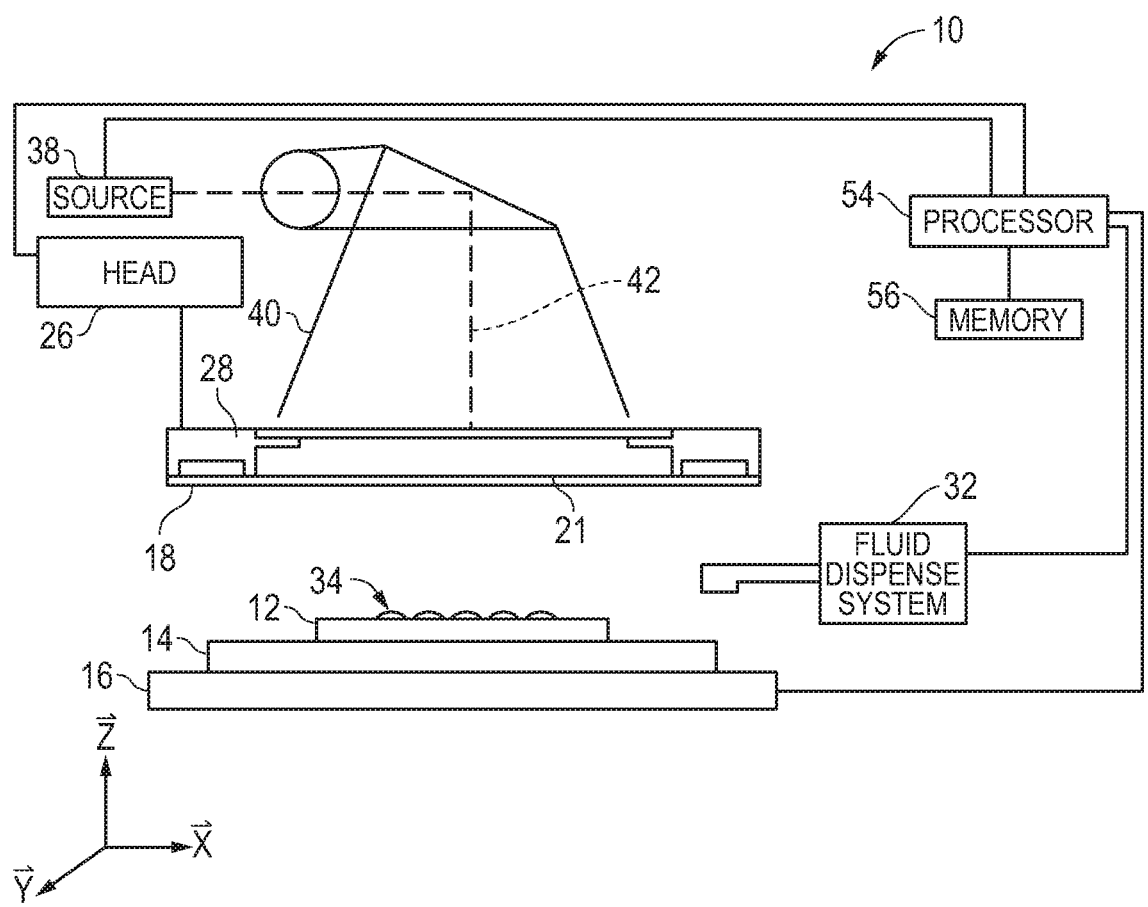
FIG. 1 includes an illustration of a side view of an exemplary apparatus.

Referring to FIG. 1, an apparatus 10 in accordance with an embodiment described herein can be used to aid in shaping a layer including a liquid precursor over a substrate 12. The substrate 12 may be coupled to a substrate chuck 14. As illustrated, the substrate chuck 14 is a vacuum chuck; however, in other embodiments the substrate chuck 14 may be any chuck including vacuum, pin-type, groove-type, electrostatic, electromagnetic, or the like. The substrate 12 and substrate chuck 14 may be further supported by a stage 16. The stage 16 may provide translating or rotational motion along the X-, Y-, or Z-directions. The stage 16, substrate 12, and substrate chuck 14 may also be positioned on a base (not illustrated).

Spaced-apart from the substrate 12 is a superstrate 18 to be used in forming an adaptive planarization. More details regarding the superstrate 18 are described later in this specification. The superstrate 18 can be coupled to a chuck 28. The chuck 28 can be configured as vacuum, pin-type, groove-type, electrostatic, electromagnetic, or another similar chuck type. In an embodiment, the chuck 28 may be coupled to a head 26 such that the chuck 28 or head 26 can facilitate movement of the superstrate 18.

The apparatus 10 can further include a fluid dispense system 32 used to deposit a planarization precursor material 34 on the substrate 12. For example, the planarization precursor material 34 can include a polymerizable material, such as a resin. The planarization precursor material 34 can be positioned on the substrate 12 in one or more layers using techniques such as droplet dispense, spin-coating, dip coating, extrusion coating, or combinations thereof. The planarization precursor material 34 can be dispensed upon the substrate 12 before or after a desired volume is defined between a superstrate 18 and the substrate 12, depending on design considerations. For example, the planarization precursor material 34 can include a monomer mixture that can be cured using ultraviolet light, heat, or the like.

The apparatus 10 can further include an energy source 38 coupled to a direct energy 40 along a path 42. The head 26 and stage 16 can be configured to position the superstrate 18 and substrate 12 in superimposition with the path 42. The superstrate 18 includes a membrane portion 21 through which energy 40 can be transmitted. The apparatus 10 can be regulated by a logic element 54 in communication with the stage 16, head 26, fluid dispense system 32, or source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

Figure 2:
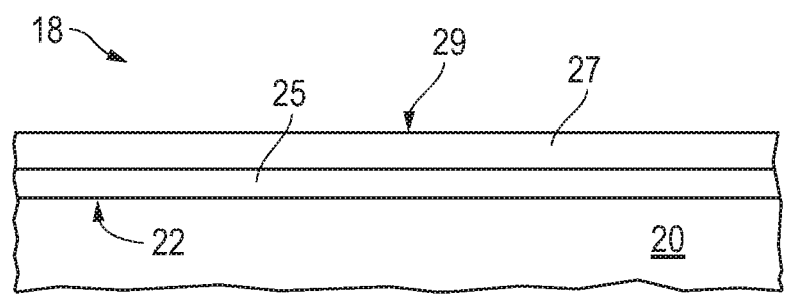
FIG. 2 includes an illustration of a cross-sectional view of a portion of a superstrate in the apparatus of FIG. 1.

Details regarding the superstrate 18 are described with respect to FIG. 2. The superstrate 18 can include a body 20 having a surface 22 that is planar. The surface 22 does not have recessions and protrusions and can be referred to as a blank. The surface 22 can have an area that is at least 90% of the area of the substrate 12 and may have area that is the same or larger than the substrate 12. In an embodiment, the surface area is at least 280 $cm^2$, at least 700 $cm^2$, at least 1100 $cm^2$, or larger, and in another embodiment, the surface area may be at most 31,500 $cm^2$. The surface 22 can have a two-dimensional shape including a circle, an ellipse, a rectangle (including a square), a hexagon, or the like. The surface 22 can have a surface roughness that can be determined using atomic force microscopy. An edge exclusion of 3 mm may be used, as readings too close to the periphery. The surface roughness may be a median value of the readings. In an embodiment, a representative amount of the area that includes the center may be used for the readings. For example, for a 300 mm diameter substrate 12, readings for the surface 22 may be taken at any location between the center and edge exclusion region; however, for a 450 mm diameter substrate 18, the readings for the superstrate may be taken within the 150 mm of the center of the superstrate 18 if the superstrate 18 is only used for 300 mm wafers. In an embodiment, the surface roughness may be for a contact area of the surface 22, wherein the contact area is an area in which the superstrate 18 contacts the planarization precursor material 34 during a contacting operation. In an embodiment, the surface roughness of the surface 22 of the body 20 is at most 1 nm, at most 0.5 nm, or at most 0.2 nm, and in another embodiment, the threshold is at least 0.1 nm.

The body 20 has a transmittance of at least 70%, at least 80%, at least 85%, or at least 90% for radiation used to cure a planarization precursor material. The body 20 can include a glass-based material, silicon, an organic polymer, a siloxane polymer, a fluorocarbon polymer, a sapphire, a spinel, another similar material, or any combination thereof. The glass-based material can include soda lime glass, borosilicate glass, alkali-barium silicate glass, aluminosilicate glass, quartz, synthetic fused-silica, or the like. The body can have a thickness in a range of 30 microns to 2000 microns.

The surface 22 of the body 20 can be covered by a buffer layer 25 and a protective layer 27. As illustrated and described later in this specification, the buffer and protective layers 25 and 27 help to reduce the likelihood of a particle that may become trapped between the superstrate 18 and a substrate and scratch the surface 22 of the body 20. The protective layer 27 or both the protective layer 27 and the buffer layer 25 can be removed and a new buffer layer and a new protective layer can be formed over the surface 22 of the body 20. The buffer layer 25 and the protective layer 27 can help to extend the life of the body 20 of the superstrate 18.

The buffer layer 25 can be formed over the surface 22 of the body 20, and the protective layer 27 can be formed over the buffer layer 25. The buffer layer 25 can have a different composition as compared to the body 20, and the protective layer 27 can have a different composition as compared to the buffer layer 25. Accordingly, the buffer layer 25 can be selectively removed as compared to the body 20, and the protective layer 27 can be selectively removed as compared to the buffer layer 25.

In an embodiment, the buffer layer 25 can have a relatively low Young's modulus as compared to the body 20 of the superstrate 18 and include an organic compound. In a particular embodiment, the buffer layer 25 includes spin-on carbon, photoresist, a chemical vapor deposition or a physically deposited carbon film, or the like. The buffer layer 25 can be applied using a coating and curing (e.g., by radiation or heat) sequence. In an embodiment, the protective layer 27 can include a transparent oxide, a nitride, or an oxynitride. In a particular embodiment, the protective layer 27 includes silicon dioxide, an aluminum oxide, or the like and can be formed by chemical vapor deposited (with or without plasma assistance), atomic layer deposition, physical vapor deposition (e.g., sputtering), spin coating, or the like.

In another embodiment, the buffer layer 25, the protective layer 27, or both are permeable to a process gas. The permeability can help to remove gas that may otherwise be trapped when the superstrate 18 contacts a planarization precursor material. The buffer layer 25, protective layer 27, or both are more permeable to the process gas as compared to the body 20. In an embodiment, the process gas may be helium. In an embodiment, each of the buffer layer 25 and the protective layer 27 can include a porous material, and exemplary porous materials are described in U.S. Pat. Nos. 8,541,053 and 9,063,409, both of which are incorporated herein by reference for their teachings regarding porous materials. Each of the buffer layer 25 and the protective layer 27 can include a deposited oxide, anodized alumina, an organo-silane, an organosilicate material, an organic polymer, inorganic polymers, and any combination thereof. Although many of the same materials are listed for the buffer layer 25 and the protective layer 27, the buffer layer 25 and the protective layer 27 for any particular superstrate have different compositions.

The thickness of the buffer layer 25, the protective layer 27, or both may be at least as thick as a particle that may become disposed between the superstrate 18 and the substrate 12 over which a planarization layer is to be formed using the superstrate 18. However, as the thickness of either or both of the buffer layer 25 and the protective layer 27 increases, the exposed surface may become too rough. In an embodiment, each of the buffer layer 25 and the protective layer 27 can have a thickness of at least 11 nm, at least 50 nm, or at least 200 nm, and in another embodiment, a thickness of at most 10000 nm, at most 5000 nm, at most 3000 nm, or at most 950 nm.

The protective layer 27 can be treated with a release compound to facilitate release of the superstrate 18 from a planarization layer formed using the superstrate 18. In an embodiment, exemplary release compounds are described in US 2010/0109195, which is incorporated herein by reference for its teachings regarding release compounds. The release compound does not significantly add to the thickness of the protective layer 27, for example less than 10 nm.

The protective layer 27 has a surface 29 having a surface roughness no greater than the surface roughness of the surface 22 of the body 20. The surface roughness can be determined using atomic force microscopy. An edge exclusion of 3 mm may be used, as readings too close to the periphery. The surface roughness may be a median value of the readings. In an embodiment, a representative amount of the area that includes the center may be used for the readings. For example, for a 300 mm diameter substrate 12, readings for the surface roughness of the protective layer 27 may be taken at any location between the center and edge exclusion region; however, for a 450 mm diameter superstrate 18, the readings for the surface 29 may be taken within the 150 mm of the center of the superstrate 18 if the superstrate 18 is only used for 300 mm wafers. In an embodiment, the surface roughness may be for a contact area of the surface 29, wherein the contact area is an area in which the superstrate 18 contacts the planarization precursor material 34 during a contacting operation. In an embodiment, the surface roughness of the surface 29 of the protective layer 27 is at most 1 nm, at most 0.5 nm, or at most 0.2 nm, and in another embodiment, the threshold is at least 0.1 nm.

In a further embodiment, the layers 25 and 27 can be replaced by a single layer. The single layer may be harder than the body of the superstrate 18. The single layer can include diamond, sapphire, spinel ($MgAl_2O_4$), aluminum oxynitride, $B_4C$, cubic or wurtzite BN, a boron-carbon-nitrogen compound (for example, $BC_2N$), or the like.

Figure 3:
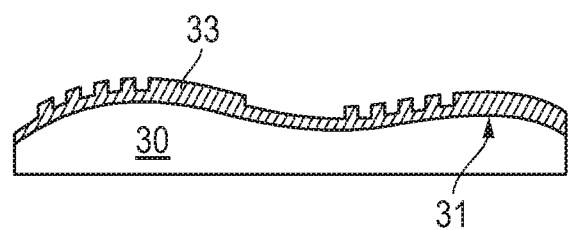
FIG. 3 includes an illustration of a cross-sectional view of a substrate having a varying topography and a patterned layer overlying the substrate.

FIGS. 3 to 6 illustrate a process in which the superstrate 18 can be used to form an adaptive planarization layer over a substrate. The features in FIGS. 3 to 6 are exaggerated to simplify understanding. FIG. 3 includes a cross-sectional view of a substrate 30, such as a semiconductor wafer, having a surface 31, and a patterned layer 33 overlies the surface 31 of the substrate 30. The patterned layer 33 can be a previously formed device layer or a resist layer.

As can be seen in FIG. 3, the substrate 30 is not perfectly flat and varies across the surface 31. Unlike adaptive planarization, a planarization layer having a planar exposed surface would have a portion with a thickness that is significantly thicker over a portion of the surface 31 that lies at a lower elevation and another portion with a thickness that is significantly thinner over another portion of the surface 31 that lies at a higher elevation. Adaptive planarization allows a layer to be formed where the upper surface of the layer more closely matches the topography of the surface 31. The layer is globally conformal and locally planar.

Figure 4:
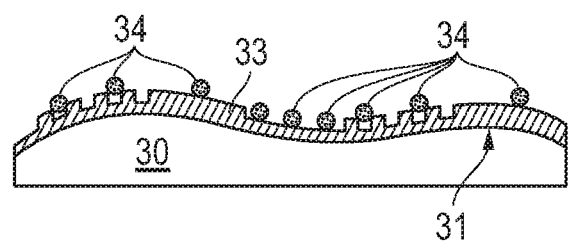
FIG. 4 includes an illustration of a cross-sectional view of the substrate and the patterned layer in FIG. 3 after dispensing a planarization precursor material.

Referring to FIGS. 1 and 4, the planarization precursor material 34 is formed over the patterned layer 33 using the apparatus 10. When using a droplet dispense method for the planarization precursor material 34, the substrate 30 and fluid dispense ports of the fluid dispense system 32 move relative to each other while dispensing fluid droplets of the planarization precursor material 34 on patterned layer 33 with a fluid droplet pattern.

Figure 5:
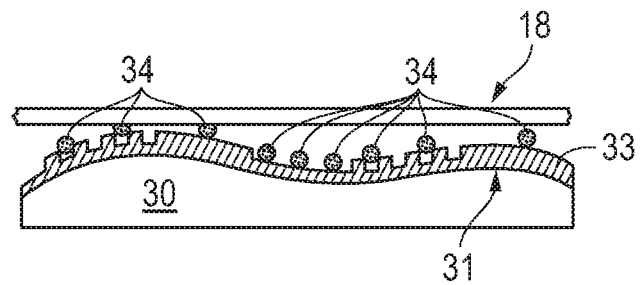
FIG. 5 includes an illustration of a cross-sectional view of the substrate, the patterned layer, and the planarization precursor material in FIG. 4 as the superstrate of FIG. 2 contacts the planarization precursor material FIG. 6 includes an illustration of a cross-sectional view of the substrate, the patterned layer, and the superstrate of FIG. 5 after forming an adaptive planarization layer.
Figure 6:
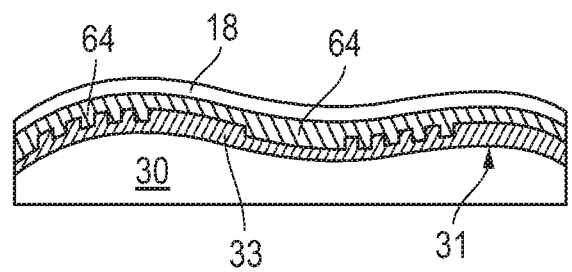

Referring to FIGS. 1, 5, and 6, the superstrate 18 is brought into contact with the planarization precursor material 34 (FIG. 5), and the planarization precursor material 34 spreads and fills the space between the superstrate 18 and the patterned layer 33. The planarization precursor material 34 is cured (e.g., photocuring or thermally) to form the planarization layer 64 (FIG. 6). After the planarization layer 64 is formed, the superstrate 18 is separated from the substrate 30 and patterned layer 33.

In theory, the superstrate 18 can be reused for hundreds or thousands of times. In practice, the body 20 of the superstrate 18 can be damaged during the planarization method described and illustrated with respect to FIGS. 3 to 6. In an embodiment, a particle may fall onto the substrate 30 or a particle may lie along the surface of the superstrate 18. Without the buffer and protective layers 25 and 27, the particle can scratch or cause another defect to the surface of the body 20, and the scratch or other defect can be replicated in subsequently-formed planarization layers for other substrates similar to substrate 12. Thus, the superstrate 18 can no longer be used.

When the buffer layer 25 and protective layer 27 are present, the scratch or other defect may extend into the protective layer 27 or the buffer layer 25 and not reach the body 20 of the superstrate 18. Thus, the lifetime of the superstrate 18 can be significantly extended when using the buffer layer 25 and the protective layer 27.

After using the superstrate 18 to form the planarization layer 64 in FIG. 6, the superstrate 18 can be inspected for scratches or other defects along the surface used in forming the planarization layer 64. The inspection can be performed by visual inspection using a bright light, dark field, scattered light, phase and specular detection methods or the like. In an embodiment, the protective layer 27 or both the protective layer 27 and buffer layer 25 may be removed and replaced by new layer(s) when the defect density exceeds a threshold. In an embodiment, the defect size can be at least 10 nm, at least 20 nm, or at least 50 nm, and in another embodiment, the defect size can be at most 1000 nm, at most 5000 nm, or at most 10000 nm. In an embodiment, the defect density is at least 0.00001 defects/cm$^2$, at least 0.00002 defects/cm$^2$, or at least 0.00005 defects/cm$^2$, and in another embodiment, the defect density is at most 0.001 defects/cm$^2$, at most 0.1 defects/cm$^2$, or at most 1.0 defect/cm$^2$.

Figure 7:
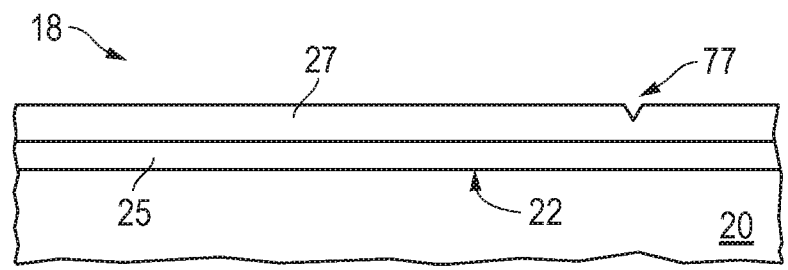
FIG. 7 includes an illustration of a cross-sectional view of the portion of the superstrate of FIG. 2 after forming a defect that extends into the protective layer.
Figure 8:
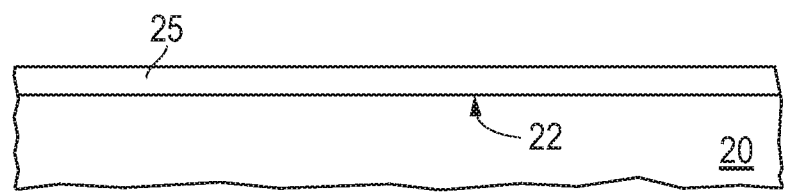
FIG. 8 includes an illustration of a cross-sectional view of the portion of the superstrate of FIG. 7 after removing the protective layer.

Referring to the embodiment illustrated in FIG. 7, a defect 77 is formed during the planarization sequence previously described. The defect 77 extends into the protective layer 27 and does not extend to the buffer layer 25 or the body 20 of the superstrate 18. The protective layer 27 is removed as illustrated in FIG. 8. If needed or desired, the exposed surface of the protective layer 27 may be cleaned before the removal to ensure the release compound, is used, or any contamination along the exposed surface is removed. The removal process may include dry etching, vacuum ultraviolet cleaning, wet etching, or the like. The compositions of the protective layer 27 and the buffer layer 25 are selected so that the protective layer 27 can be removed selectively to the buffer layer 25. In a particular embodiment, the protective layer 27 includes a silicon oxide or a silicon oxynitride, and the buffer layer 25 includes an organic material. The protective layer 27 can be exposed to a fluorine-containing etchant that reacts with the protective layer 27 and removes the protective layer 27. The buffer layer 25 does not significantly react with the fluorine-containing etchant.

After removing the protective layer 27, the superstrate 18 can be inspected to confirm the defect 77 did not reach the buffer layer 25. In addition to or as part of the inspection, the buffer layer 25 can be inspected to confirm the exposed surface of the buffer layer 25 has not become significantly roughened during the removal of the protective layer 27. If the buffer layer 25 has become too rough (surface roughness exceeds the previously described limits), the buffer layer 25 may also be replaced, even if the defect 77 did not extend to the buffer layer 25. In a particular embodiment, the defect 77 did not extend to the buffer layer 25, and the exposed surface of the buffer layer 25 is sufficiently smooth. A new protective layer 27 can be formed over the buffer layer 25 to produce the superstrate 18 as illustrated in FIG. 2. The new protective layer 27 can have any of the materials previously described with respect to the protective layer 27. The new protective layer 27 can have the same or different composition as compared to the prior protective layer 27. In an embodiment, the new protective layer 27, just like the prior protective layer 27, has a composition different from the buffer layer 25.

Figure 9:
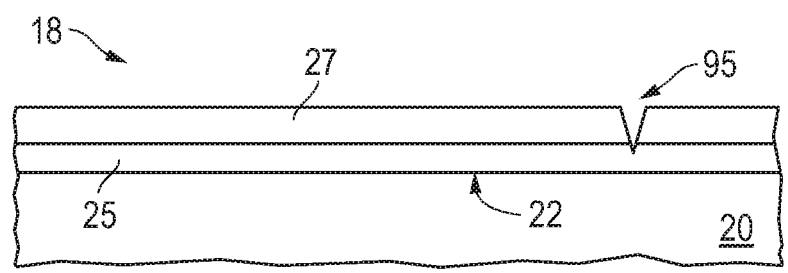
FIG. 9 includes an illustration of a cross-sectional view of the portion of the superstrate of FIG. 2 after forming a defect that extends through the protective layer and into the buffer layer.

The superstrate 18 with the new protective layer 27 is used to form another planarization layer 64 in FIG. 6. As previously described, the superstrate 18 can be inspected for scratches or other defects along the surface used in forming the planarization layer 64. Referring to the embodiment illustrated in FIG. 9, a defect 95 is formed during the planarization sequence previously described. The defect 95 extends through the protective layer 27 and into the buffer layer 25, but the defect does not extend to the body 20 of the superstrate 18.

Figure 10:
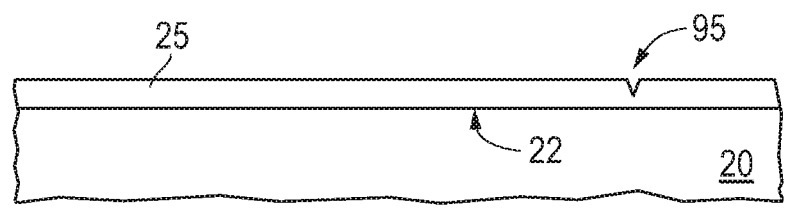
FIG. 10 includes an illustration of a cross-sectional view of the portion of the superstrate of FIG. 9 after removing the protective layer.
Figure 11:
FIG. 11 includes an illustration of a cross-sectional view of the portion of the superstrate of FIG. 10 after removing the buffer layer.

The protective layer 27 is removed as illustrated in FIG. 10. The protective layer 27 can be cleaned, optionally, and removed as previously described. The compositions of the buffer layer 25 and the body 20 are selected so that the buffer layer 25 can be removed selectively to the body 20. The removal process may include dry etching, vacuum ultraviolet cleaning, wet etching, or the like. In a particular embodiment, the buffer layer 25 includes an organic material, and the body 20 includes a silica-based glass. The buffer layer 25 can be ashed (using an oxygen-containing plasma) or a piranha clean (for example, $H_2SO_4$ and $H_2O_2$ at a temperature in a range of 100° C. to 150° C.) that reacts with the buffer layer 25 and removes the buffer layer 25. The body 20 does not significantly react during ashing or piranha clean.

After removing the buffer layer 25, the superstrate 18 can be inspected to confirm the defect 95 did not reach the body 20. In addition to or as part of the inspection, the roughness of the now exposed surface of the body 20 did not become significantly roughened during the removal of the layers 25 and 27. If the body 20 is too rough (surface roughness exceeds the previously described limits), the superstrate 18 may be rejected and no longer used. In a particular embodiment, the defect 95 did not extend to the body 20, and the exposed surface of the body 20 is sufficiently smooth. New buffer and protective layers 25 and 27 can be formed over the body 20 to produce the superstrate 18 as illustrated in FIG. 2. Each of the new buffer and protective layers 25 and 27 can have any of the materials previously described with respect to the buffer and protective layers 25 and 27, respectively. The new buffer layer 25 can have the same or different composition as compared to the prior buffer layer 25. The new protective layer 27 can have the same or different composition as compared to the prior protective layer 27. In an embodiment, the new buffer layer 25, just like the prior buffer layer 25, has a composition different from the body 20, and the new protective layer 27, just like the prior protective layer 27, has a composition different from the buffer layer 25. Another planarization sequence as previously described with respect to FIGS. 3 to 6.

In a particular embodiment, the removal of the buffer and protective layers 25 and 27 is not performed using a lift-off process. The layers 25 and 27 extend over substantially all of the body 20 of the superstrate 18 that can be nearly the same size of the substrate 12. If a lift-off process would be used, the removal process would take far too long. Although removal techniques can be made highly selective, exposure for days or weeks to an etchant to remove the buffer layer 25 may still affect the body 20, as etch selectivity of the buffer layer 25 to the body 20 may not be infinity. Also, prolonged exposure to an etchant to remove the buffer layer 25 may roughen or introduce contamination along the surface 22 of the body 20. Still further, such roughening or contamination may be non-uniform along the surface 22. Furthermore, the lift-off process typically results in a high amount of particles that poses a significantly higher risk of damaging the body 20 during the removal of the layers 25 and 27, as compared to sequentially etching the protective layer 27 and then the buffer layer 25, as previously described.

Embodiments as described herein are useful in extending the life of superstrates. Use of either or both of the buffer layer 25 and protective layer 27 helps to reduce the likelihood that scratches or other defects extend to the body 20 of the superstrate 18. Thus, a superstrate can be used for more planarization sequences as compared to a superstrate that does not use the buffer layer 25 or the protective layer 27. Materials for the buffer and protective layers 25 and 27 can be selected to allow selective removed of each. Further, depositing new buffer and protective layers can be performed without a significant complication.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A superstrate comprising:
   a body having a surface;
   a buffer layer overlying the surface; and
   a protective layer overlying the buffer layer, wherein the protective layer has a surface that has a surface roughness that is no greater than a surface roughness of the surface of the body, wherein the surface roughness of the protective layer is less than 1 nm over a contact area of the superstrate, and
   wherein the protective layer includes a material that can be selectively removed with respect to the buffer layer.

2. The superstrate of claim 1, wherein the body has a transmittance of at least 70% for radiation used to cure a planarization precursor material.

3. The superstrate of claim 1, wherein the protective layer includes a nitride, an oxynitride, or a transparent oxide.

4. The superstrate of claim 1, wherein the buffer layer includes an organic compound.

5. The superstrate of claim 1, wherein the buffer layer includes spin-on carbon, photoresist, a physically deposited carbon film, or a chemical vapor deposition.

6. The superstrate of claim 1, wherein the buffer layer, the protective layer, or both are more permeable to a process gas, as compared to the body.

7. The superstrate of claim 6, wherein the process gas is helium.

8. The superstrate of claim 1, wherein the buffer layer or the protective layer comprises a deposited oxide, anodized alumina, an organo-silane, an organosilicate material, an organic polymer, inorganic polymers, and any combination thereof.

9. The superstrate of claim 1, wherein the body includes soda lime glass, quartz, borosilicate glass, alkali-barium silicate glass, aluminosilicate glass, or synthetic fused silica.

10. A superstrate comprising:
    a body having a surface;
    a buffer layer overlying the surface; and
    a protective layer overlying the buffer layer, wherein the protective layer has a surface that has a surface roughness that is no greater than a surface roughness of the surface of the body, wherein the protective layer includes a material that can be selectively removed with respect to the buffer layer, wherein the protective layer is treated with a release compound to facilitate release of the superstrate from a layer formed using the superstrate.

11. A superstrate for forming a planarization layer over a substrate, the superstrate comprising:
    a body having a surface; and
    a layer overlying the surface,
    wherein the layer includes a material that is selectively etchable with respect to the body, and wherein the layer has a surface that has a surface roughness that is no greater than a surface roughness of the surface of the body, wherein the surface roughness of the layer is less than 1 nm over a contact area of the superstrate.

12. The superstrate of claim 11, wherein a surface area of the superstrate is larger than a surface area of the substrate.

* * * * *